United States Patent
Lee

(10) Patent No.: US 7,126,434 B2
(45) Date of Patent: Oct. 24, 2006

(54) OSCILLATOR CIRCUIT FOR SEMICONDUCTOR DEVICE

(75) Inventor: Seok Joo Lee, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 67 days.

(21) Appl. No.: 11/010,165

(22) Filed: Dec. 10, 2004

(65) Prior Publication Data

US 2005/0253661 A1 Nov. 17, 2005

(30) Foreign Application Priority Data

May 11, 2004 (KR) ........................ 10-2004-0033214

(51) Int. Cl.
*H03L 1/00* (2006.01)

(52) U.S. Cl. ........................ 331/176; 331/175; 331/185

(58) Field of Classification Search ................ 331/176, 331/185, 175, 57
See application file for complete search history.

(56) References Cited

U.S. PATENT DOCUMENTS 6,486,727 B1* 11/2002 Kwong ........................ 327/534

* cited by examiner

*Primary Examiner*—Arnold Kinkead
(74) *Attorney, Agent, or Firm*—Marshall, Gerstein & Borun LLP

(57) ABSTRACT

An oscillator circuit for a semiconductor device is disclosed which can generate internal clocks having a stable period regardless of variations of a process of transistors and resistors, a power voltage and a temperature, by controlling an oscillator unit by separating a gate voltage and a reference voltage, and which can normally operate chip functions according to the stable internal clocks without suffering from large variations by external factors.

11 Claims, 4 Drawing Sheets

OSCILLATOR CIRCUIT FOR SEMICONDUCTOR DEVICE

This application relies for priority upon Korean Patent Application No. 2004-0033214 filed May 11, 2004, the contents of which are herein incorporated by reference in their entirety.

BACKGROUND

1. Field of the Invention

The present patent relates to an oscillator circuit for a semiconductor device, and more particularly to, an oscillator circuit which has a stable period regardless of variations of a process, a power voltage and a temperature.

2. Discussion of Related Art

In general, circuits that must use internal clocks as well as external clocks exist in a memory device and an IC chip. Especially, in a flash memory, a micro-controller or a pump circuit use internal clocks without receiving external clocks. An oscillator circuit generates such internal clocks.

A ring oscillator that is a basic oscillator is formed by connecting an odd number of inverters in series, and feeding back an output from the last terminal as an input of the first inverter. Although very simple in structure, the ring oscillator is influenced by variations of a process, a power voltage and a temperature (PVT variations), and thus a period thereof is seriously varied. In order to solve the above problem, there has been used a circuit which determines a period by RC delay effects by connecting a constant current source to an inverter or adding a resistor, a capacitor, a Schmit trigger or a comparator. However, if a period is varied due to external variations or an area resistance value is varied by a process, a period of an oscillator is also varied.

SUMMARY OF THE INVENTION

The present patent is directed to an oscillator circuit which has a relatively stable period regardless of variations of a process of transistors and resistors, a power voltage and a temperature, by using different control voltages in a clock generating unit using an SR latch.

One aspect of the present invention is to provide an oscillator circuit for a semiconductor device, including: a reference voltage generating unit for generating a reference voltage according to an enable signal and a band-gap voltage, and varying a voltage level of the reference voltage to compensate for a variation of a period of an internal clock signal by external factors; a gate voltage generating unit driven according to the enable signal, for generating a gate voltage by voltage distributions of a power voltage, and varying a voltage level of the gate voltage to compensate for the variation of the period of the internal clock signal by external factors; and an oscillator unit for generating the internal clock signal having a predetermined period according to the enable signal, the reference voltage and the gate voltage.

Preferably, the reference voltage generating unit includes: an input voltage decreasing unit for decreasing the power voltage to a predetermined level according to the enable signal and the band-gap voltage, and outputting the resulting voltage as a first voltage; an output control unit for distributing the first voltage, and generating a second voltage varied due to variations of a threshold voltage of the device and a temperature in order to compensate for the period of the internal clock signal by external factors; and an output unit for increasing a voltage level of the second voltage, and outputting the resulting voltage as the reference voltage.

Preferably, the output control unit includes: a first transistor driven according to the first voltage, for applying the first voltage to the second voltage output terminal; a first native transistor connected between the first voltage input terminal and the second voltage output terminal and driven according to the second voltage output terminal; a second native transistor connected between the second voltage output terminal and a first node and driven according to the first node; and a second transistor connected between the first node and a ground voltage and driven according to the first node.

Preferably, the gate voltage generating unit includes: a first transistor driven according to the power voltage, for transmitting the power voltage to the gate voltage output terminal; a first resistor connected between the power voltage and the gate voltage output terminal; and a second transistor and a third transistor connected in series between the gate voltage output terminal and a ground power, and driven according to the gate voltage and the enable signal, respectively.

Preferably, the oscillator unit includes: a first control voltage generating unit driven according to the enable signal, for transmitting a first control voltage for determining the period of the clock according to an inverted input signal, the gate voltage and the reference voltage; a second control voltage generating unit driven according to the enable signal, for transmitting a second control voltage for determining the period of the clock according to an input signal, the gate voltage and the reference voltage; and an SR latch unit for generating the clock signal according to the first and second control voltages.

Preferably, the first and second control voltage generating units each respectively includes: a first PMOS transistor connected between the power voltage and the first node and driven according to the input signal; a first NMOS transistor connected to the first node and driven according to the input signal; a second NMOS transistor connected between the first NMOS transistor and the ground power and driven according to the gate voltage; a first capacitor connected between the first node and the ground power; a comparator having its negative terminal connected to receive the voltage from the first node and its positive terminal connected to receive the reference voltage, and generating the control voltage; and a third PMOS transistor connected between the power voltage and the output terminal of the comparator and driven according to the enable signal.

DETAILED DESCRIPTION OF PREFERRED EMBODIMENTS

Figure 1:
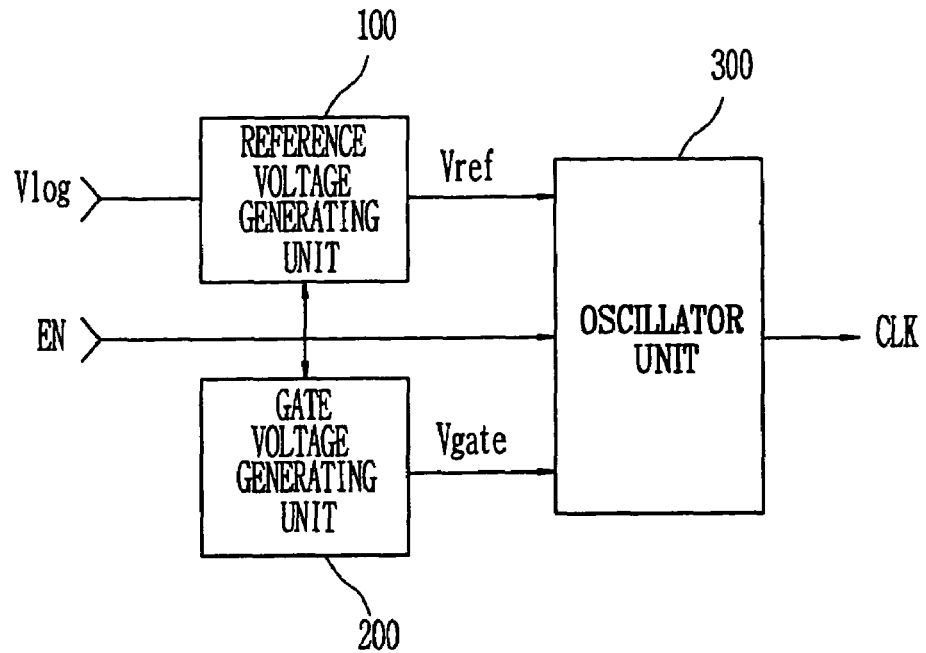
FIG. 1 is a block diagram illustrating an oscillator circuit for a semiconductor device in accordance with the present invention.

An oscillator circuit for a semiconductor device in accordance with various embodiments will now be described in detail with reference to the accompanying drawings. The embodiment of the present invention can be modified in various forms, which is not intended to be limiting. The embodiment of the present invention is provided to fully explain the present invention to the ordinary people in the art to which the present invention pertains. Wherever possible, the same reference numerals will be used throughout the drawings and the description to refer to the same or like parts.

FIG. 1 is a block diagram illustrating the oscillator circuit for the semiconductor device in accordance with the present invention.

Referring to FIG. 1, the oscillator circuit includes a reference voltage generating unit 100 for generating a reference voltage Vref according to an enable signal EN and a band-gap voltage Vbg, and varying a voltage level of the reference voltage Vref to compensate for a variation of a period of a clock signal CLK by external factors, a gate voltage generating unit 200 driven according to the enable signal EN, for generating a gate voltage Vgate by voltage distributions of a power voltage, and varying a voltage level of the gate voltage Vgate to compensate for the variation of the period of the clock signal CLK by external factors; and an oscillator unit 300 for generating the clock signal CLK having a predetermined period according to the enable signal EN, the reference voltage Vref and the gate voltage Vgate.

Figure 2:
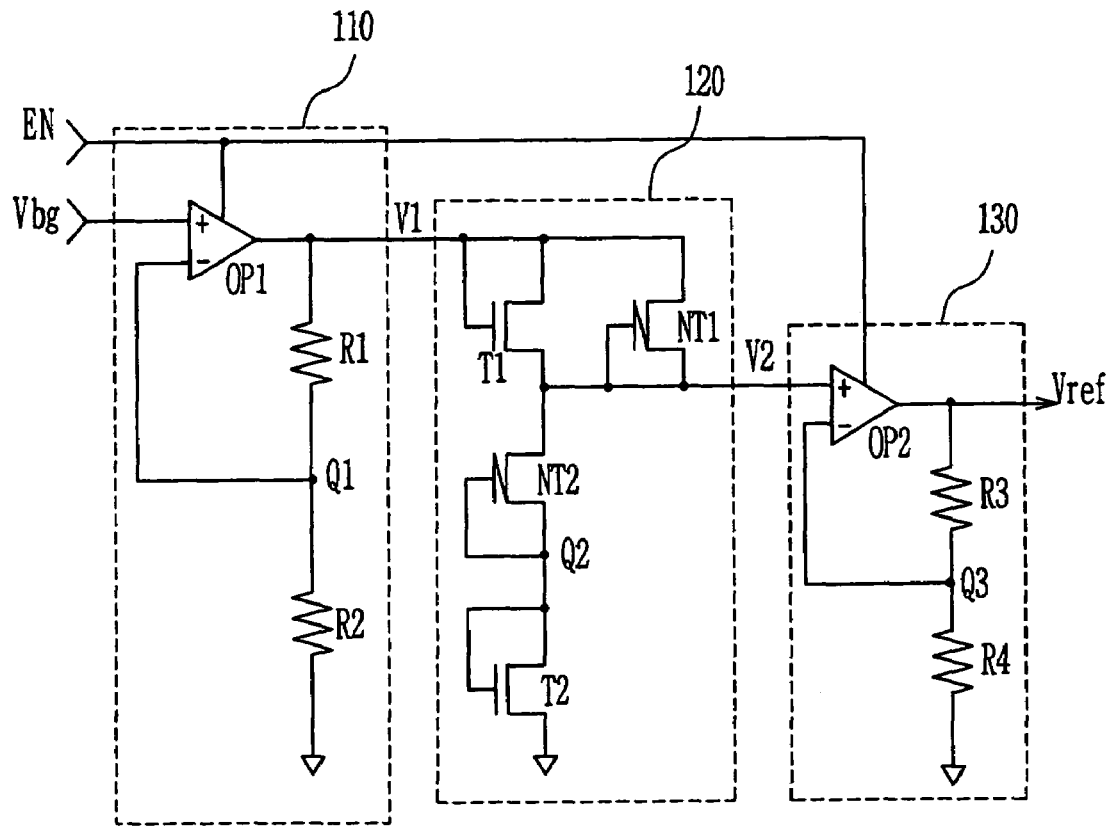
FIG. 2 is a circuit diagram illustrating a reference voltage generating unit in accordance with the present invention.

FIG. 2 is a circuit diagram illustrating the reference voltage generating unit in accordance with the present invention.

As illustrated in FIG. 2, the reference voltage generating unit 100 includes an input voltage decreasing unit 110 for decreasing the power voltage to a predetermined level according to the enable signal EN and the band-gap voltage Vbg, and outputting the resulting voltage as a first voltage V1, an output control unit 120 for distributing the first voltage V1, and generating a second voltage V2 varied due to variations of a threshold voltage of the device and a temperature in order to compensate for the period of the clock signal CLK by external factors, and an output unit 130 for increasing a voltage level of the second voltage V2, and outputting the resulting voltage as the reference voltage Vref. Preferably, the band-gap voltage Vbg outputted from a band-gap voltage generating unit (not shown) has a constant voltage value which is not varied by external factors.

The input voltage decreasing unit 110 includes a first OP amp OP1 being operated according to the enable signal EN, having its positive terminal connected to receive the band-gap voltage Vbg and its negative terminal connected to receive a voltage value from a first node Q1, and outputting the first voltage V1, a first resistor R1 connected between the first voltage V1 output terminal and the first node Q1, and a second resistor R2 connected between the first node Q1 and a ground power. The output control unit 120 includes a first transistor T1 driven according to the first voltage V1, for applying the first voltage V1 to the second voltage V2 output terminal, a first native transistor NT1 connected between the first voltage V1 input terminal and the second voltage V2 output terminal and driven according to the second voltage V2 output terminal, a second native transistor NT2 connected between the second voltage V2 output terminal and a second node Q2 and driven according to the second node Q2, and a second transistor T2 connected between the second node Q2 and a ground voltage and driven according to the second node Q2. The output unit 130 includes a second OP amp OP2 being operated according to the enable signal EN, having its positive terminal connected to receive the second voltage V2 and its negative terminal connected to receive a voltage value from a third node Q3, and outputting the reference voltage Vref, a third resistor R3 connected between the reference voltage Vref output terminal and the third node Q3, and a fourth resistor R4 connected between the third node R3 and the ground power. Preferably, the first and second transistors T1 and T2 are NMOS transistors.

Figure 3:
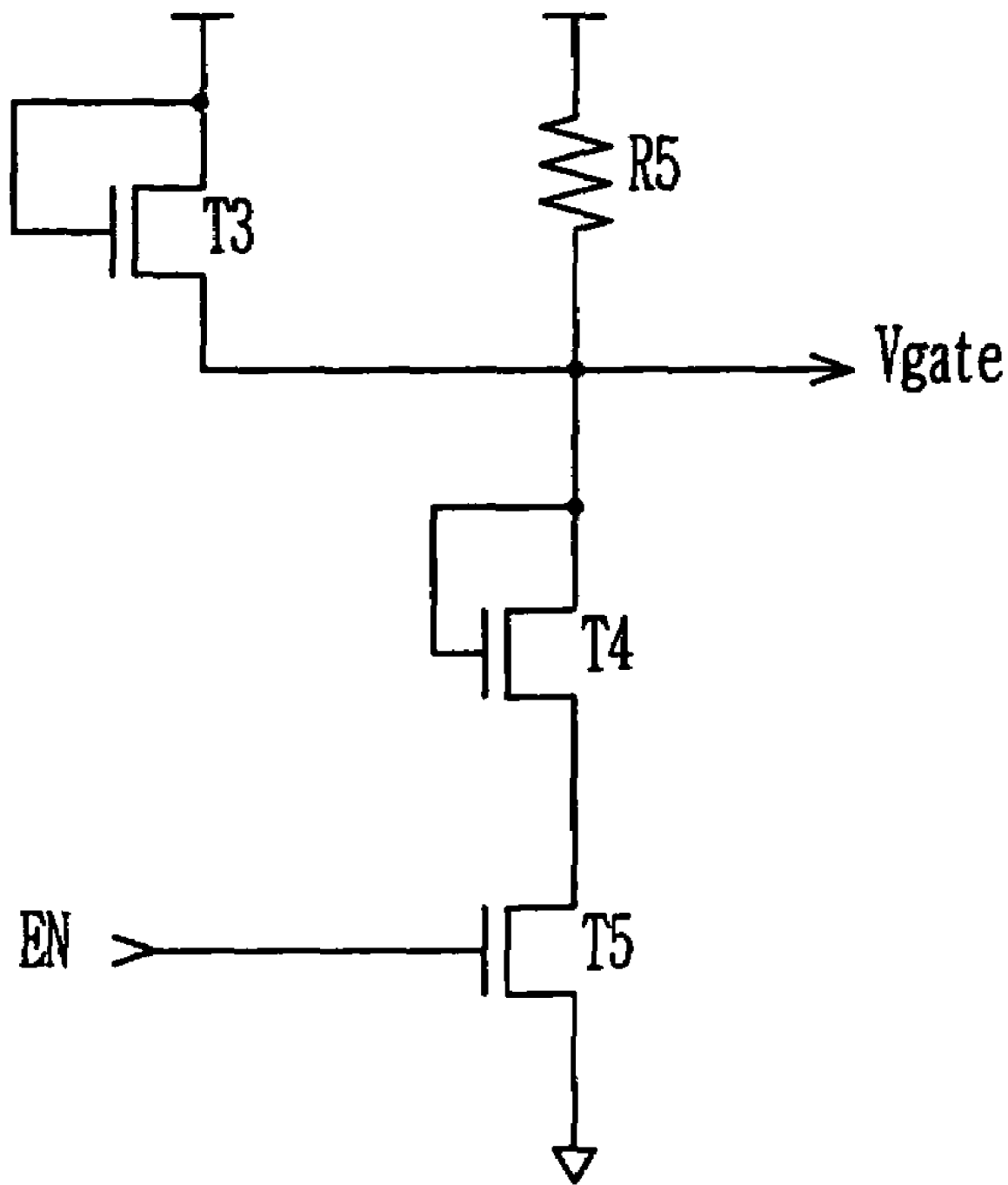
FIG. 3 is a circuit diagram illustrating a gate voltage generating unit in accordance with the present invention.

FIG. 3 is a circuit diagram illustrating the gate voltage generating unit in accordance with the present invention.

As depicted in FIG. 3, the gate voltage generating unit 200 includes a third transistor T3 driven according to the power voltage, for transmitting the power voltage to the gate voltage Vgate output terminal, a fifth resistor R5 connected between the power voltage and the gate voltage Vgate output terminal, and a fourth transistor T4 and a fifth transistor T5 connected in series between the gate voltage Vgate output terminal and the ground power, and driven according to the gate voltage Vgate and the enable signal EN, respectively. Preferably, the third to fifth transistors T3 to T5 are NMOS transistors.

Figure 4:
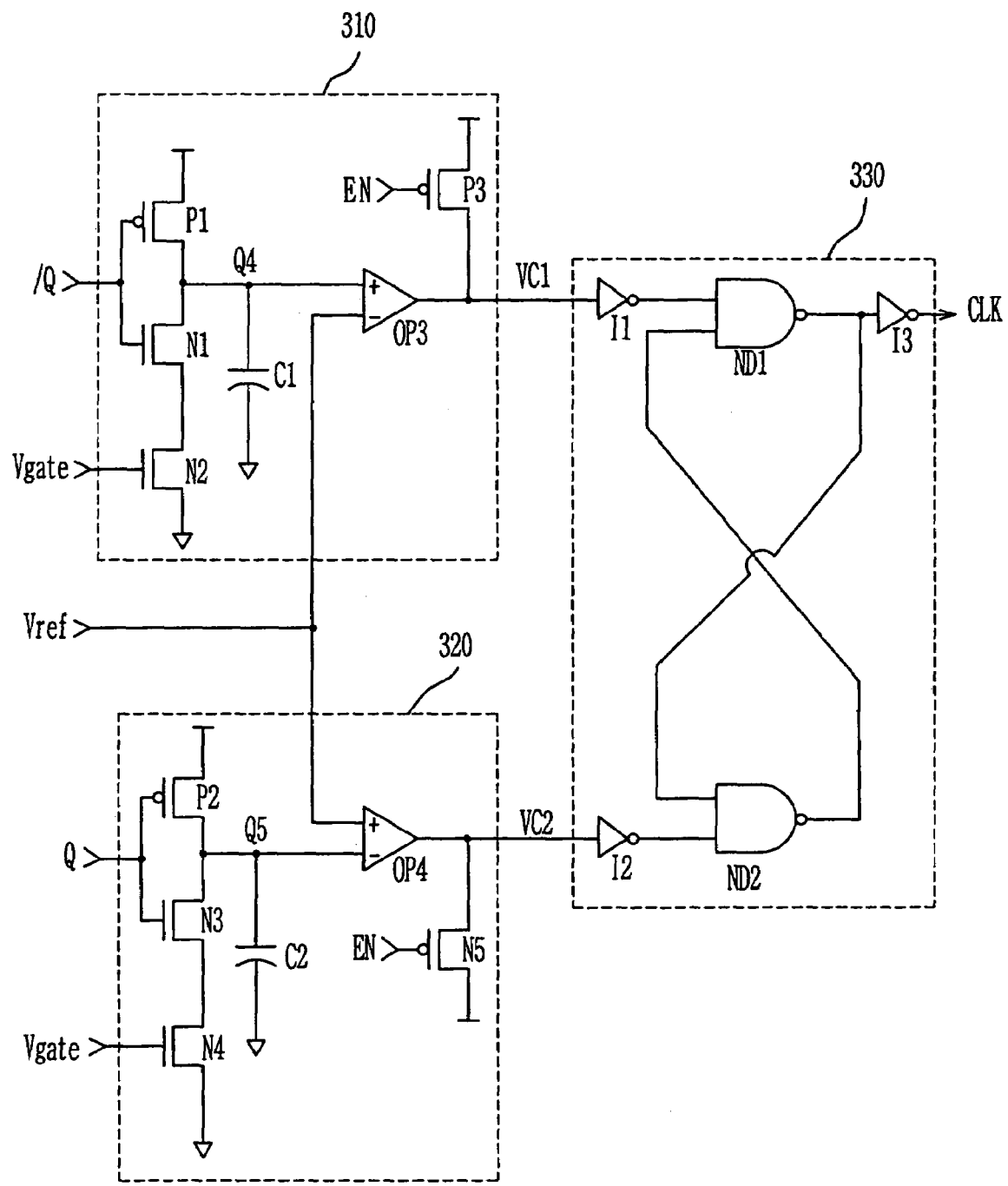
FIG. 4 is a circuit diagram illustrating an oscillator unit in accordance with the present invention.

FIG. 4 is a circuit diagram illustrating an oscillator unit in accordance with the present invention.

As shown in FIG. 4, the oscillator unit 300 includes a first control voltage generating unit 310 driven according to the enable signal EN, for transmitting a first control voltage Vc1 for determining the period of the clock according to an inverted input signal /Q, the gate voltage Vgate and the reference voltage Vref, a second control voltage generating unit 320 driven according to the enable signal EN, for transmitting a second control voltage Vc2 for determining the period of the clock according to an input signal Q, the gate voltage Vgate and the reference voltage Vref, and an SR latch unit 330 for generating the clock signal CLK according to the first and second control voltages Vc1 and Vc2.

The first control voltage generating unit 310 includes a first PMOS transistor P1 connected between the power voltage and a fourth node Q4 and driven according to the inverted input signal /Q, a first NMOS transistor N1 connected to the fourth node Q4 and driven according to the inverted input signal /Q, a second NMOS transistor N2 connected between the first NMOS transistor N1 and the ground power and driven according to the gate voltage Vgate, a first capacitor C1 connected between the fourth node N4 and the ground power, a first comparator OP3 having its negative terminal connected to receive the voltage from the fourth node Q4 and its positive terminal connected to receive the reference voltage Vref, and generating the first control voltage Vc1, and a third PMOS transistor P3 connected between the power voltage and the output terminal of the first comparator OP1 and driven according to the enable signal EN. The second control voltage generating unit 320 includes a second PMOS transistor P2 connected between the power voltage and a fifth node Q5 and driven according to the input signal Q, a third NMOS transistor N3 connected to the fifth node Q5 and driven according to the input signal Q, a fourth NMOS transistor N4 connected between the third NMOS transistor N3 and the ground power and driven according to the gate voltage Vgate, a second capacitor C2 connected between the fifth node N5 and the ground power, a second comparator OP4 having its negative terminal connected to receive the voltage from the fifth node Q5 and its positive terminal connected to receive the reference voltage Vref, and generating the second control voltage Vc2, and a fifth NMOS transistor N5 connected between the power voltage and the output terminal of the second comparator OP2 and driven according to an inverted enable signal ENb. The SR latch unit 330 includes a first inverter I1 for inverting the first control voltage Vc1, a second inverter I2 for inverting the second control voltage Vc2, first and second NAND gates ND1 and ND2 latch-connected to each other, and a third inverter I3 for inverting the output from the first NAND gate ND1.

The operation of the oscillator circuit in accordance with the present invention will now be described.

The control voltage applied to the oscillator unit 300 is divided into the reference voltage Vref and the gate voltage Vgate. The period of the clock can be maintained constant, by increasing the voltage levels of the reference voltage Vref and the gate voltage Vgate according to increase of the threshold voltage of the device and increase of a temperature. That is, the reference voltage Vref and the gate voltage Vgate which control the period of the oscillator unit 300 are varied in the direction of making the period constant, namely, in the direction of increasing the voltage levels according to increase of the threshold voltage of the transistor and the temperature, thereby stabilizing the period. In addition, the variation of the gate voltage Vgate is maintained smaller than the variation of the reference voltage Vref, thereby preventing the period of the clock from being varied by a large width.

When receiving the external enable signal EN, the oscillator circuit is driven. The gate voltage generating unit 200 generates the predetermined level of gate voltage Vgate by distributing the power voltage. Here, about 0.9 to 1.0V of gate voltage Vgate is generated. The reference voltage generating unit 100 also generates the predetermined level of reference voltage Vref.

The channels of the second and fourth NMOS transistors N2 and N4 of the first and second control voltage generating units 310 and 320 are varied according to the gate voltage Vgate, thereby reducing an amount of current leaked to the ground. In addition, in consideration of delay by the first and second capacitors C1 and C2, the falling time of the first PMOS transistor P1 and the first NMOS transistor N1 and the second PMOS transistor P2 and the third NMOS transistor N3 connected to the inverters is longer than the rising time thereof. Here, when the voltages of the fourth node Q4 and the fifth node Q5 of the first and second control voltage generating units 310 and 320 become lower than the reference voltage Vref, the voltages are inverted and inputted to the SR latch unit 330. The output from the SR latch unit 330 is inverted at the falling edge of any one of the first and second control voltages Vc1 and Vc2, and fed back to the first inverter of the opposite end. That is, the period of the whole circuit is determined by the delay time of the second and fourth NMOS transistors N2 and N4 and the first and second capacitors C1 and C2.

In this case, when the threshold voltage of the device and the temperature increase, the current does not well flow through the second and fourth NMOS transistors N2 and N4, thereby increasing the period. In addition, when the voltage increases, an amount of charges charged in the first and second capacitors C1 and C2 increases, and an amount of charges discharged through the second and fourth NMOS transistors N2 and N4 increases, which results in increase of the period. However, in accordance with the present invention, the current smoothly flows through the second and fourth NMOS transistors N2 and N4 by increasing the gate voltage Vgate in the period increase conditions, thereby making the period constant. Moreover, a signal inversion time point becomes fast by increasing the reference voltage Vref. That is, when increase of the gate voltage Vgate and the reference voltage Vref precisely compensates for increase of the period, the period becomes constant. The current variation width of the second and fourth NMOS transistors N2 and N4 is very sensitive to even a small variation of the gate voltage Vgate. Preferably, when the temperature increases, an increase amount of the gate voltage Vgate is small. Preferably, when the power voltage of the device increases, the period increased due to increase of the voltage is compensated for by increasing the gate voltage Vgate by a predetermined level.

In accordance with the present invention, the period is maintained constant regardless of variations of the temperature and the threshold voltage, by adjusting the reference voltage Vref inputted to the first and second comparators OP3 and OP4. The reference voltage generating unit 100 uses the first and second native transistors N and N2 instead of resistors, and thus shows a relatively large variation in the wanted direction in regard to variations of the threshold voltage and the temperature, as compared with the gate voltage Vgate. Because the gate voltage Vgate sufficiently compensates for the variation of the period by the variation of the power voltage, a voltage decreasing circuit is formed by using the band-gap voltage Vbg and the first OP amp OP1, for decreasing the power voltage to a predetermined voltage. Since the output voltage is low, the output voltage is amplified as high as the gate voltage Vgate by the second OP amp OP2.

Figure 5:
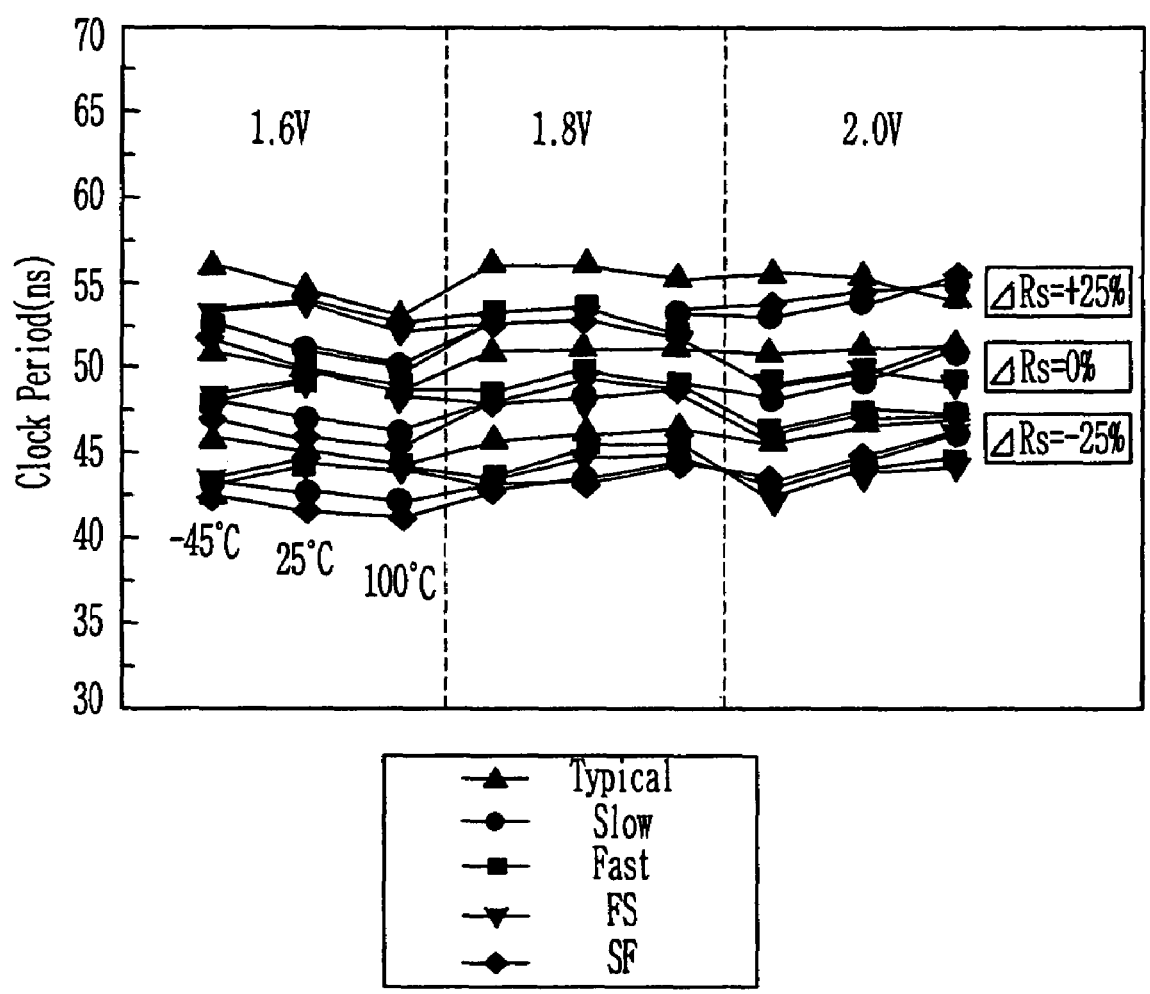
FIG. 5 is a graph showing a variation of a period in accordance with the present invention.

FIG. 5 is a graph showing the variation of the period in accordance with the present invention.

Referring to FIG. 5, when the period of the oscillator is set 50 ns, the variation of the period by variations of the power voltage, temperature and threshold voltage exists within ±5%. Even if the resistance value is varied by ±25%, the variation of the whole period exists within ±10%. As a result, the variation of the period is more reduced.

As discussed earlier, in accordance with the present invention, the oscillator circuit for the semiconductor device can generate the internal clocks having the stable period regardless of variations of the process of the transistors and resistors, the power voltage and the temperature, by controlling the oscillator unit by separating the gate voltage and the reference voltage.

Moreover, the oscillator circuit for the semiconductor device can normally operate chip functions according to the stable internal clocks without suffering from large variations by external factors.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. An oscillator circuit for a semiconductor device, comprising:
    a reference voltage generating unit for generating a reference voltage according to an enable signal and a band-gap voltage, and varying a voltage level of the reference voltage to compensate for a variation of a period of an internal clock signal by external factors;
    a gate voltage generating unit driven according to the enable signal, for generating a gate voltage by voltage distributions of a power voltage, and varying a voltage level of the gate voltage to compensate for the variation of the period of the internal clock signal by external factors; and an oscillator unit for generating the internal clock signal having a predetermined period according to the enable signal, the reference voltage and the gate voltage.

2. The oscillator circuit of claim 1, wherein the reference voltage generating unit comprises:

an input voltage decreasing unit for decreasing the power voltage to a predetermined level according to the enable signal and the band-gap voltage, and outputting the resulting voltage as a first voltage;

an output control unit for distributing the first voltage, and generating a second voltage varied due to variations of a threshold voltage of the device and a temperature in order to compensate for the period of the internal clock signal by external factors; and an output unit for increasing a voltage level of the second voltage, and outputting the resulting voltage as the reference voltage.

3. The oscillator circuit of claim 2, wherein the output control unit comprises:

a first transistor driven according to the first voltage, for applying the first voltage to the second voltage output terminal;

a first native transistor connected between the first voltage input terminal and the second voltage output terminal and driven according to the second voltage output terminal;

a second native transistor connected between the second voltage output terminal and a first node and driven according to the first node; and a second transistor connected between the first node and a ground voltage and driven according to the first node.

4. The oscillator circuit of claim 1, wherein the gate voltage generating unit comprises:

a first transistor driven according to the power voltage, for transmitting the power voltage to the gate voltage output terminal;

a first resistor connected between the power voltage and the gate voltage output terminal; and a second transistor and a third transistor connected in series between the gate voltage output terminal and a ground power, and driven according to the gate voltage and the enable signal, respectively.

5. The oscillator circuit of claim 1, wherein the oscillator unit comprises:

a first control voltage generating unit driven according to the enable signal, for transmitting a first control voltage for determining the period of the clock according to an inverted input signal, the gate voltage and the reference voltage;

a second control voltage generating unit driven according to the enable signal, for transmitting a second control voltage for determining the period of the clock according to an input signal, the gate voltage and the reference voltage; and an SR latch unit for generating the clock signal according to the first and second control voltages.

6. The oscillator circuit of claim 5, wherein the first and second control voltage generating units each respectively comprises:

a first PMOS transistor connected between the power voltage and the first node and driven according to the input signal;

a first NMOS transistor connected to the first node and driven according to the input signal;

a second NMOS transistor connected between the first NMOS transistor and the ground power and driven according to the gate voltage;

a first capacitor connected between the first node and the ground power;

a comparator having its negative terminal connected to receive the voltage from the first node and its positive terminal connected to receive the reference voltage, and generating the control voltage; and a third PMOS transistor connected between the power voltage and the output terminal of the comparator and driven according to the enable signal.

7. An oscillator circuit for a semiconductor device, comprising:

a reference voltage generating unit for generating a reference voltage according to an enable signal and a band-gap voltage, and varying a voltage level of the reference voltage to compensate for a variation of a period of an internal clock signal by external factors;

a gate voltage generating unit driven according to the enable signal, for generating a gate voltage by voltage distributions of a poxver voltage, and varying a voltage level of the gate voltage to compensate for the variation of the period of the internal clock signal by external factors; and an oscillator unit for generating the internal clock signal having a predetermined period according to the enable signal, the reference voltage and the gate voltage, wherein the reference voltage generating unit comprises:
an input voltage decreasing unit for decreasing the power voltage to a predetermined level according to the enable signal and the band-gap voltage, and outputting the resulting voltage as a first voltage;

an output control unit for distributing the first voltage, and generating a second voltage varied due to variations of a threshold voltage of the device and a temperature in order to compensate for the period of the internal clock signal by external factors; and an output unit for increasing a voltage level of the second voltage, and outputting the resulting voltage as the reference voltage.

8. The oscillator circuit of claim 7, wherein the output control unit comprises:

a first transistor driven according to the first voltage, for applying the first voltage to the second voltage output terminal;

a first native transistor connected between the first voltage input terminal and the second voltage output terminal and driven according to the second voltage output terminal;

a second native transistor connected between the second voltage output terminal and a first node and driven according to the first node; and a second transistor connected between the first node and a ground voltage and driven according to the first node.

9. The oscillator circuit of claim 7, wherein the gate voltage generating unit comprises:

a first transistor driven according to the power voltage, for transmitting the power voltage to the gate voltage output terminal;

a first resistor connected between the power voltage and the gate voltage output terminal; and a second transistor and a third transistor connected in series between the gate voltage output terminal and a ground power, and driven according to the gate voltage and the enable signal, respectively.

10. The oscillator circuit of claim 7, wherein the oscillator unit comprises:
a first control voltage generating unit driven according to the enable signal, for transmitting a first control voltage for determining the period of the clock according to an inverted input signal, the gate voltage and the reference voltage;
a second control voltage generating unit driven according to the enable signal, for transmitting a second control voltage for determining the period of the clock according to an input signal, the gate voltage and the reference voltage; and
an SR latch unit for generating the clock signal according to the first and second control voltages.

11. The oscillator circuit of claim 10, wherein the first and second control voltage generating units each respectively comprises:

a first PMOS transistor connected between the power voltage and the first node and driven according to the input signal;
a first NMOS transistor connected to the first node and driven according to the input signal;
a second NMOS transistor connected between the first NMOS transistor and the ground power and driven according to the gate voltage;
a first capacitor connected between the first node and the ground power;
a comparator having its negative terminal connected to receive the voltage from the first node and its positive terminal connected to receive the reference voltage, and generating the control voltage; and
a third PMOS transistor connected between the power voltage and the output terminal of the comparator and driven according to the enable signal.

* * * * *

UNITED STATES PATENT AND TRADEMARK OFFICE
CERTIFICATE OF CORRECTION

PATENT NO. : 7,126,434 B2 Page 1 of 1
APPLICATION NO. : 11/010165
DATED : October 24, 2006
INVENTOR(S) : Seok J. Lee It is certified that error appears in the above-identified patent and that said Letters Patent is hereby corrected as shown below:

In the Claims:

Column 8, line 24, "poxver" should be -- power --.

Signed and Sealed this

Twenty-seventh Day of March, 2007

JON W. DUDAS
*Director of the United States Patent and Trademark Office*